United States Patent [19]

Rammelsberg

[11] Patent Number: 4,599,601
[45] Date of Patent: Jul. 8, 1986

[54] ABSOLUTE INCREMENTAL ENCODER

[75] Inventor: Gert-Dieter Rammelsberg, Munich, Fed. Rep. of Germany

[73] Assignee: Litton Precision Products International GmbH, Munich, Fed. Rep. of Germany

[21] Appl. No.: 629,569

[22] Filed: Jul. 10, 1984

[30] Foreign Application Priority Data

Jul. 13, 1983 [DE] Fed. Rep. of Germany ....... 3325318

[51] Int. Cl.$^4$ ............................................. H03M 1/24
[52] U.S. Cl. .................................. 340/347 P; 377/17
[58] Field of Search ..................... 340/347 P, 347 SY; 377/3, 17; 324/175

[56] References Cited

U.S. PATENT DOCUMENTS

| | | | |
|---|---|---|---|
| 2,944,159 | 7/1960 | Leff | 377/3 |
| 4,234,787 | 11/1980 | Hutter et al. | 377/17 |
| 4,363,026 | 12/1982 | Salmon | 340/347 P |
| 4,384,275 | 5/1983 | Masel et al. | 340/347 P |

FOREIGN PATENT DOCUMENTS 2448239  2/1979  Fed. Rep. of Germany ... 340/347 P

Primary Examiner—L. T. Hix
Assistant Examiner—David M. Gray
Attorney, Agent, or Firm—Brian L. Ribando

[57] ABSTRACT

An incremental angular encoder includes a device for the selected setting of an absolute zero reference pulse. The device consists of a reduction mechanism 16, which is connected on the input side to the shaft 11 of the angular encoder and, on the output side, to an output disk 18 which has an opto-electronically scannable hole or light reflection mark 19. The disk 18 is provided with gear teeth 23 and is connected by a friction clutch 17 to the reduction unit 16. The angular position of the output disk 18 can be adjusted relative to the reduction mechanism 16 by means of a toothed key 22 provided with a pinion, allowing the absolute zero point to be exactly set. By selection of the gear wheels ($R_1$, $R_2$, $R_3$, $R_4$) of the reduction mechanism 16, the reduction ratio can be varied within wide limits and, consequently, the absolute zero point can be set over a wide range.

6 Claims, 6 Drawing Figures

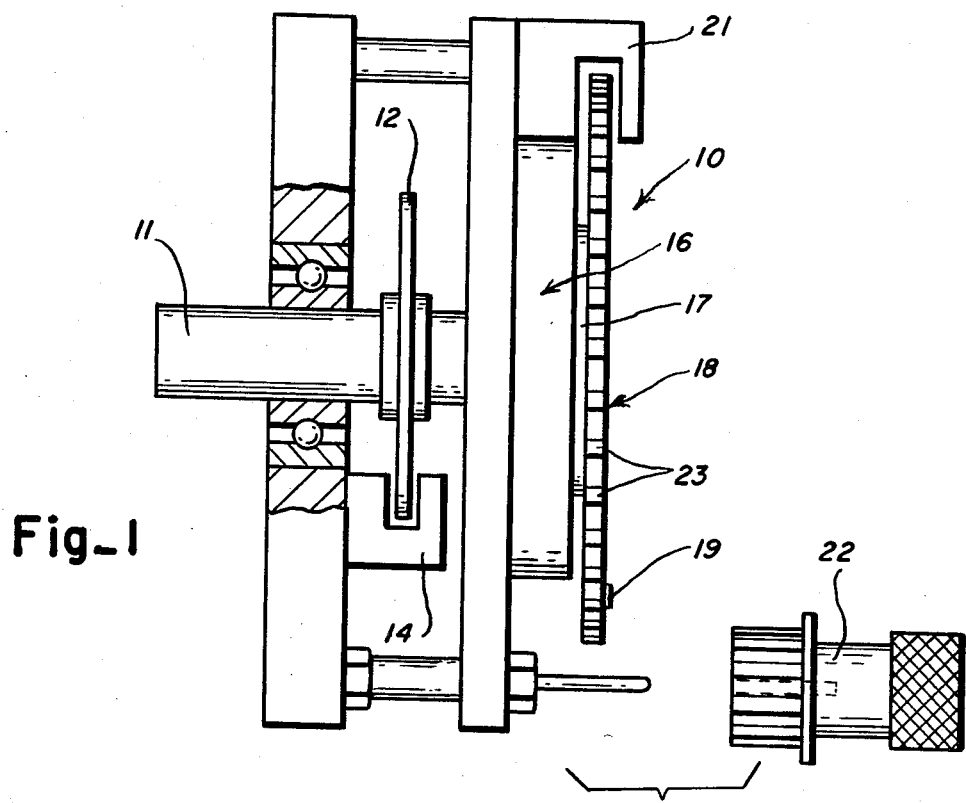
Fig_1
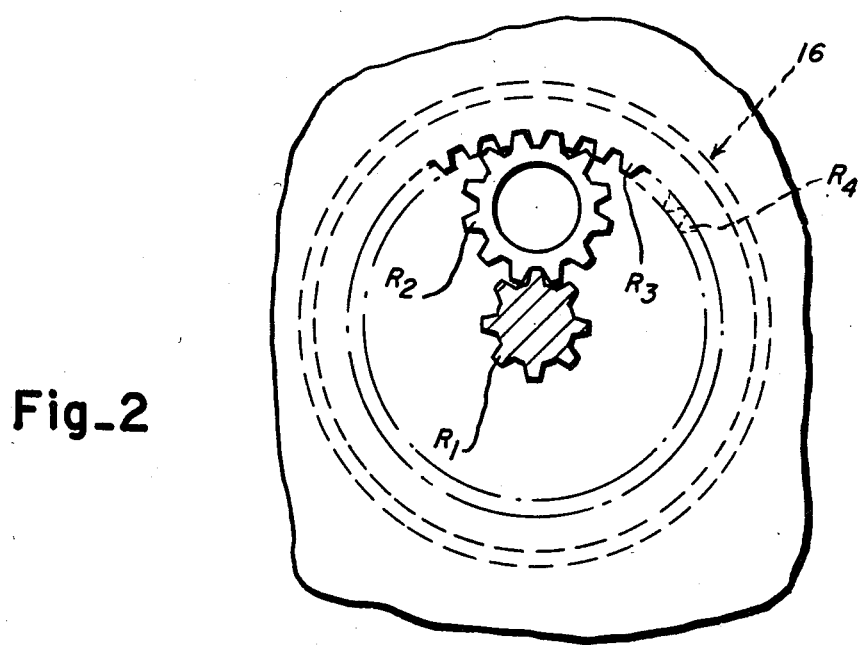
Fig_2

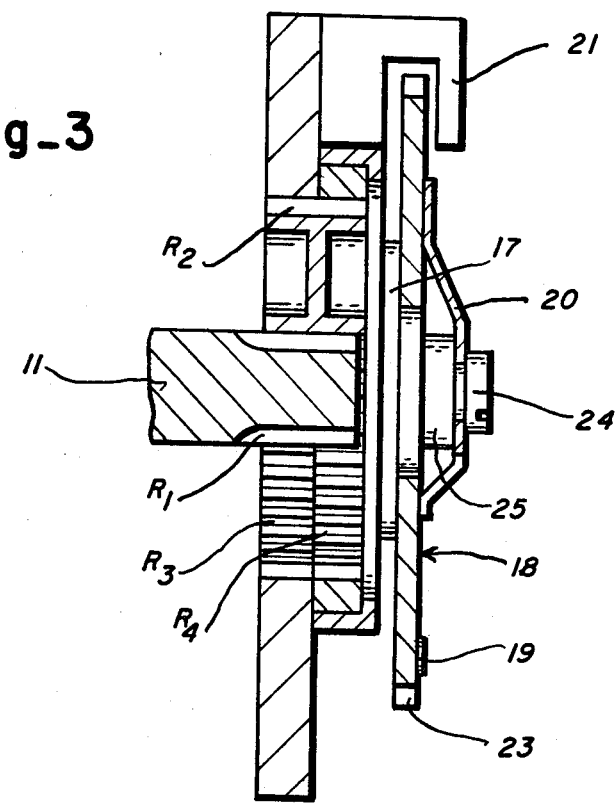
Fig_3
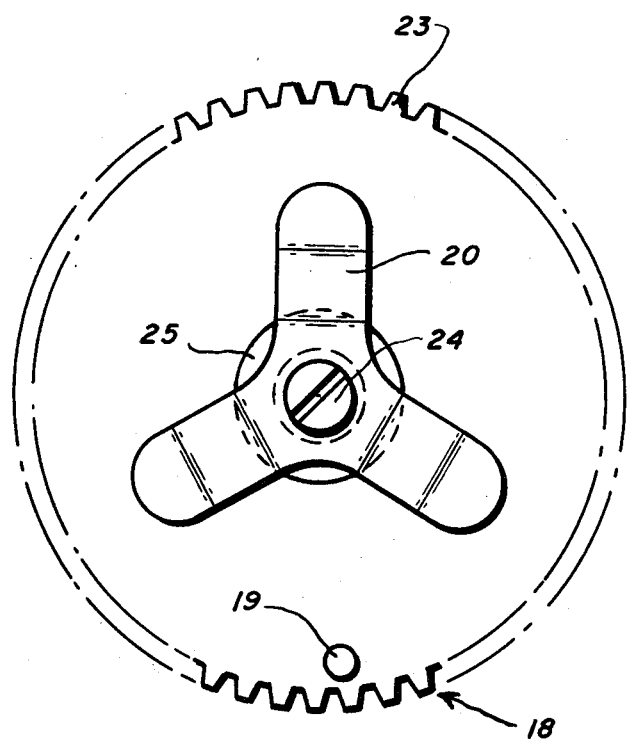
Fig_4

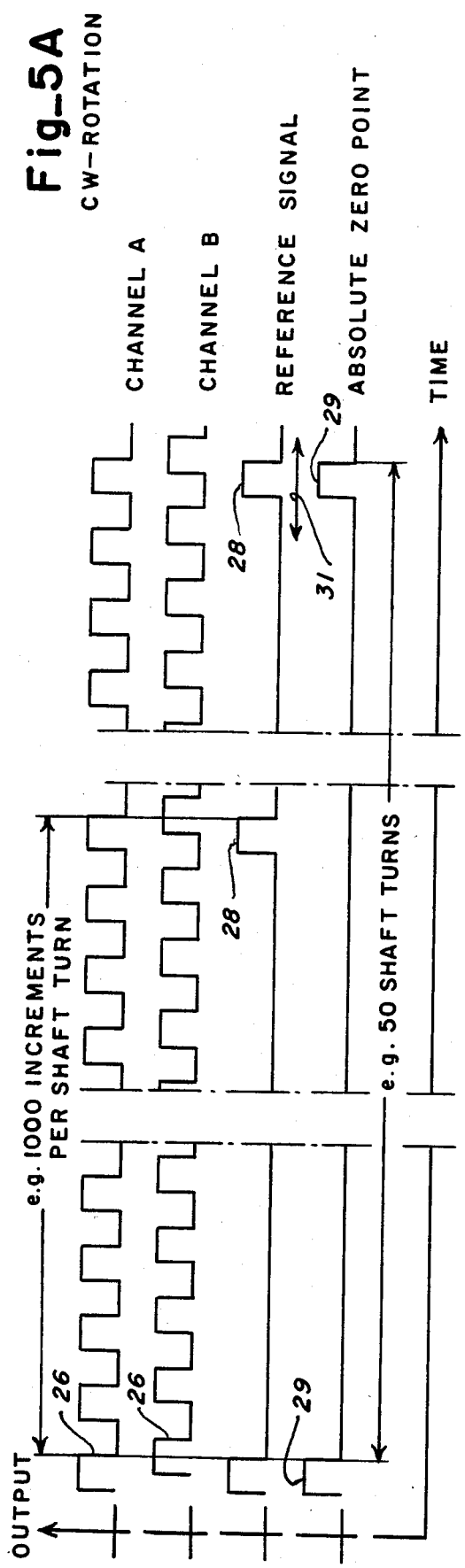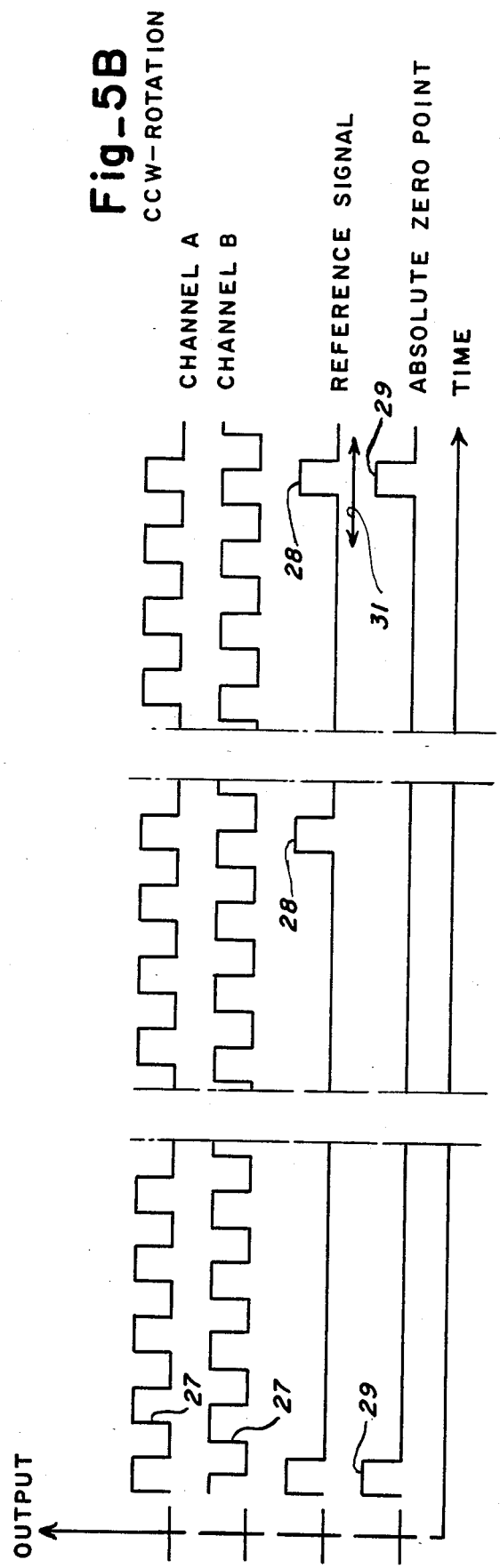

ABSOLUTE INCREMENTAL ENCODER

BACKGROUND OF THE INVENTION

This invention relates to an incremental angular encoder, i.e. a measurement sensor, which generates a digital signal representative of the instantaneous angular position of the shaft of the encoder.

There are two versions of angular encoders which emit their output signals in a digital format. One version is the so-called absolute angular encorder, which emits the angular information in a digital code, i.e. the angular value is immediately available in absolute form at any time, even after an operational interruption or a failure of the supply voltage of a system in which the angular encoder is installed. It is necessary to differentiate between such absolute angular encoders and an incremental angular encoder, which sub-divides one revolution of the angular encoder shaft, i.e. a rotational angle of 360°, into a defined number of steps—"increments".

The present invention concerns incremental angular encoders. In order to indicate the direction of rotation, the increment information in the form of binary signals is emitted on two different channels, i.e. at two separate connections, on a first channel A, and on a second channel B. Information regarding the direction of rotation can be derived by comparing the phase of the signal outputs on the two channels relative to one another. If, for example, channel A switches before channel B, the angular encoding shaft is rotating clockwise. If, on the other hand, channel B switches before channel A, the shaft is rotating counter-clockwise. The output signals on both channels are usually emitted in the form of binary signals. In many incremental angular encoders, a so-called reference signal is also supplied; this appears once per revolution, i.e. after each 360° rotation of the shaft.

If such an incremental angular encoder is used in a system, for example as a distance measurement element perhaps in an industrial robot the output pulse signals which are generated must be counted by an electronic counting device in order to obtain information, for example on the distance traversed by the tool attached to the end of the arm of the robot. In contrast, when an absolute angular encoder is used, only a code converter is necessary because, as already mentioned, the absolute angular information is not lost even with a voltage interruption and there is a fixed relationship between the shaft angular position and the encoder output signal. One disadvantage of absolute angular encoders, however, is their high price, which becomes disproportionately higher with increasing encoder resolution. Another disadvantage is the increase in the size of the encoder as the resolution becomes greater. In contrast, the incremental angular encoder has the advantage of smaller physical size, particularly at high values of angular resolution, and a substantially lower price. However, an important disadvantage, which has already been discussed, is that after interruption and reconnection of the supply voltage, no information whatever is available on the angular position of the shaft and this is immediately lost again if the supply voltage fails—even briefly.

To remedy such problems, one prior art solution establishes a reference point. When the supply voltage is switched on, it is first necessary to drive the unit mechanically to this reference point so that the system can establish a zero point. This can be accomplished through the use of a reference signal, appearing once per revolution of the angular encoder shaft, and signals from proximity switches, end switches and the like. Such an approach involves expenditure on additional switches, which require additional wiring and adjustment work for installation and, unfortunately, can represent an additional source of error.

In most cases, incremental angular encoders are used to measure distances. A distance of $X_n$, for example, is then represented by n output pluses or steps of the angular encoder. For this distance, several revolutions of the encoder shaft are generally necessary. It follows that the reference signal of the angular encoder, appearing every 360°, i.e. once per revolution of the shaft, cannot be used alone for determining the system zero point. Rather the reference signal must be used in conjunction with the sensor signals already mentioned to ensure a reproducible system zero point. Particularly in the manufacture of industrial robots, however, difficulties arise in generating this system zero point because the necessary sensor must be attached for example to the front tool—i.e. the hand—which means that the electrical signal must be carried by cable which is rotated and pivoted. In many cases, slip-rings must be used in the rotational or pivoted joints.

OBJECTS AND SUMMARY OF THE INVENTION

It is therefore an object of the invention to provide an incremental angular encoder characterized by a settable absolute zero or reference point which requires no additional switches in the associated mechanism for the reproducible setting of the system zero point.

It is another object of the invention to provide an incremental angular encoder characterized by an absolute zero point which can be set for any angular position of the encoder itself.

The objects of the invention are attained by providing a mechanical element, in particular an output disk which is connected to the output shaft of the angular encoder via a reduction gearbox, which output disk can only execute a maximum rotation of 360° in response to the maximum number of output shaft revolutions of the angular encoder in a particular application. This output disk is provided with a switch mark as the zero point reference, the switch mark being sensed by an electrical scanning device so that the desired zero point reference signal can be supplied. The output disk is connected to the output side of the reduction gear by a friction clutch so that the zero point can be established for any position of the output shaft. The zero point switch mark can, for example, be a hole through the rotating element, or a mark which is sensed by an opto-electronic scanning device to obtain the zero point reference signal.

In the preferred embodiment form, the rotating element is a disk having gear teeth on the circumference thereof which is not rigidly connected to the output side of the reduction gear but is connected by a friction clutch, so that the switch point of the zero mark can be set manually by rotating the switch gear wheel using a special pinion-type toothed key.

BRIEF DESCRIPTION OF THE DRAWINGS

The invention and advantageous details are described more precisely below in conjunction with the accompanying drawing figures in which:

FIG. 1 is a side view partly in section of an incremental angular encoder in accordance with the invention;

FIG. 2 is a detail view of the gear reducer used in the encoder of FIG. 1;

FIG. 3 is a side view partly in section of the gear reducer and output disk used in the encoder of FIG. 1;

FIG. 4 is an end view of the output disk used in the encoder of FIG. 1; and

FIGS. 5A and 5B are diagrammatic representations of the time relationship of the output signals of an incremental angular encoder in accordance with the invention.

As shown, in FIG. 1, an incremental angular encoder 10 is provided with a shaft 11. A glass disk 12 rotates with the shaft 11 and is provided along its outer periphery with chromium markings. An opto-electronic converter unit 14 connected to the casing of the encoder 10 converts, by means of known analysis electronics, the periodic switching on and off of an infra-red light beam, caused by the chromium markings on the glass disk 12, into a measurement signal. A further chromium marking is located on the glass disk and is sensed once per revolution of the disk 12 to produce a reference signal.

A reduction mechanism 16 is connected on the input side to the shaft 11 and, on the output side, via a friction clutch 17, to an output disk 18. The output disk 18 has on its edge a hole or marking 19 which may be sensed by a second opto-electronic scanning device 21.

The reduction ratio of the reduction gear mechanism 16 can be selected for a particular application in such a way that the maximum total number of revolutions of the encoder shaft 11 in a given application will result in only one zero point reference point being generated by the second scanning device 21. In order to set this zero point reference point, the output disk 18 is rotated, by a special pinion-type toothed key 22 which engages the gear teeth 23 provided for this purpose on the output disk 18, until the zero point reference signal appears when the robot tool is in the starting position.

FIGS. 2 and 3 shows the reduction gear mechanism 16. The shaft 11 with the pinion $R_1$ formed on its end, is the mechanical input for the reduction mechanism 16. The pinion $R_1$ engages a planetary gear wheel $R_2$, which in turn engages with two internally toothed wheels, namely, a fixed gear wheel $R_3$ and an, axially, immediately adjacent internally toothed output gear $R_4$. A friction disk 17 is attached to the output gear $R_4$, and a spider clamp 20 presses the rear face of the output disk 18 against the friction disk 17 to transmit the rotation of the output gear $R_4$ to the output disk 18. The spider clamp 20 is secured to the friction disk hub 25 by a screw 24. The friction disk 17 between the output gear $R_4$ and the disk 18 allows the disk 18 can be manually rotated relative to the output gear $R_y$ by means of the special pinion-type toothed key 22 which engages the circumferential gear teeth 23. For reasons of weight saving and to reduce inertia, the planetary gear wheel $R_2$ can be relieved, as shown.

FIG. 4 is an end view of the output disk 18 showing the spider clamp 20 secured to the friction disk hub 25 by the screw 24. The legs of the spider clamp 20 press on the face of the output disk 18.

EXAMPLE 1

A tooth module (not illustrated) of 0.3 was selected and, for selected numbers of teeth of $Z_{R1}=42$, $Z_{R2}=42$, $Z_{R3}=126$ and $Z_{R4}=129$, a reduction ration of $U=172$ was obtained from the formula $$U = \frac{2 \times Z_{R4} \times (Z_{R1} + Z_{R2})}{3 \times Z_{R1}}$$

In the example selected, the difference in the numbers of teeth between the gear wheel $R_3$ and the gear wheel $R_4$ is three teeth. In this case, three planetary gear wheels $R_2$ can be used, these being located with a displacement of exactly 120° in each case in order to provide better centering. This, however, makes no difference in principle to the manner of operation of the gear. If the difference in the numbers of teeth between the internally toothed gear wheels $R_3$ and $R_4$ is two teeth, then two planetary gear wheels $R_2$ can be provided, whereas with a tooth diffrence of one tooth, only one planetary gear wheel $R_2$ can be used.

EXAMPLE 2

In the embodiment shown in FIGS. 2 and 3, $Z_{R1}=8$, $Z_{R2}=12$, $Z_{R3}=36$, and $Z_{R4}=37$, assuming a difference of one between $Z_{R3}$ and $Z_{R4}$. In this example, the reduction ration $U=61.7$.

The examples show that the reduction ratio U of the reduction gear unit 16 can be varied over a wide range by an appropriate choice of the numbers of teeth on the pinion $R_1$, on the planetary gear wheel $R_2$ and/or on the fixed gear wheel $R_3$ and loose gear wheel $R_4$.

FIGS. 5A and 5B show two examples of the time relationship of the output signals of the encoder; 5A shows clockwise rotation, and 5B shows counter-clockwise rotation of the shaft 11. Differentiation between clockwise and counter-clockwise rotation can be carried out by means of the two channels A and B. As shown on FIG. 5A, if a particular signal edge, for example the falling edge 26, appears earlier on channel A than on channel B, then rotation is clockwise. FIG. 5B shows the rising edge 27 appearing later on channel A than on channel B indicating counter-clockwise rotation. A reference signal 28 appears, with reference to the channel A, after each complete rotation of the shaft 11. For one rotation of the shaft 11, 1,000 pulses are generated, thus dividing the rotation into 1,000 increments. The absolute zero signal 29 shown in the bottom line of both signal diagrams can, but does not have to be, synchronized with the reference signal 28; a slight displacement in time can also be provided. In the example shown, a signal 29 indicating the absolute zero point is generated once for every 50 rotations of the shaft 11.

It will be appreciated by those skilled in the art that as indicated by an arrow 31, the location of the absolute zero signal 29 can be varied relative to the other signals generated by the encoder, firstly with respect to the number of pulses generated on channel A or channel B per occurrence of the signal 29—by appropriate choice of the gear wheels of the reduction gear 16, and, secondly—relative to the reference signal 28—by means of the special key 22.

Having thus described the invention, various alterations and modifications will be apparent to those skilled in the art, which alterations and modifications are intended to be within the scope of the invention as defined by the appended claims.

What is claimed is:

1. In an incremental angular encoder;
   an encoder shaft,
   an output disk coupled for rotation in response to rotation of the encoder shaft, an absolute zero marking on the output disk, means for selectively rotating the output disk without causing the rotation of the encoder shaft, and a scanning device coupled to the housing of the encoder and position to sense the absolute zero marking, the scanning device generating an absolute zero reference signal in response to the sensing of the absolute zero marking.

2. The incremental angular encoder of claim 1 further comprising:

a reduction gear mechanism interposed between the encoder shaft to the output disk.

3. The incremental angualr encoder of claim 2 further comprising, a friction clutch coupled between the reduction gear mechanism and the output disk comprising the means for selectively rotating, whereby the output disk is driven by the friction clutch and may be selectively rotated relative to the reduction gear mechanism in order to set the position of the absolute zero marking on the output disk relative to the position of the encoder shaft.

4. The incremental angular encoder of claim 3 further comprising;

gear teeth formed on the circumference of the output disk, whereby the output disk may be rotated relative to the encoder output shaft by a pinion key.

5. The incremental angular encoder of claim 2 wherein the reduction gear mechanism comprises;

a planetary gear driven by the encoder shaft, and two internally toothed gear wheels, both of which are engaged with the planetary gear, one of which is the output of reduction gear mechanism.

6. In an incremental encoder;

an encoder shaft, an encoder disk driven by said encoder shaft and a first sensing device for producing a series of output pulses in response to rotation of said encoder disk, a reduction gear mechanism having a selected gear ratio and being driven by said encoder shaft, an output disk having an absolute zero reference mark thereon, a second sensing device for producing an absolute zero signal in response to said absolute zero reference mark, and a friction disk coupling the output drive of said reduction gear mechanism to said output disk, whereby said disk rotates in response to the output drive of said reduction gear mechanism, and may be rotated relative to the output drive of said reduction gear mechanism, and whereby only one absolute zero signal is produced in response to the maximum number of encoder shaft revolutions in a given application.

* * * * *